(12) United States Patent
Yoneda et al.

(10) Patent No.: US 12,062,883 B2
(45) Date of Patent: Aug. 13, 2024

(54) SEMICONDUCTOR MODULE AND METHOD OF MANUFACTURING SAME

(71) Applicant: Mitsubishi Electric Corporation, Tokyo (JP)

(72) Inventors: Yutaka Yoneda, Tokyo (JP); Junji Fujino, Tokyo (JP); Tadayoshi Hata, Tokyo (JP); Jin Sato, Isahaya (JP)

(73) Assignee: Mitsubishi Electric Corporation, Tokyo (JP)

( * ) Notice: Subject to any disclaimer, the term of this patent is extended or adjusted under 35 U.S.C. 154(b) by 972 days.

(21) Appl. No.: 16/965,889

(22) PCT Filed: Mar. 12, 2019

(86) PCT No.: PCT/JP2019/009904
§ 371 (c)(1),
(2) Date: Jul. 29, 2020

(87) PCT Pub. No.: WO2019/176912
PCT Pub. Date: Sep. 19, 2019

(65) Prior Publication Data
US 2021/0057876 A1 Feb. 25, 2021

(30) Foreign Application Priority Data
Mar. 15, 2018 (JP) .................. 2018-048443

(51) Int. Cl.
*H01S 5/00* (2006.01)
*H01S 5/022* (2021.01)
(Continued)

(52) U.S. Cl.
CPC .......... *H01S 5/02375* (2021.01); *H01S 5/022* (2013.01); *H01S 5/02315* (2021.01);
(Continued)

(58) Field of Classification Search
CPC .. H01S 5/02375; H01S 5/022; H01S 5/02315; H01S 5/0237; H01S 5/0239; H01S 5/02476; H01S 5/02415
See application file for complete search history.

(56) References Cited

U.S. PATENT DOCUMENTS

2002/0089913 A1* 7/2002 Moriyama .............. H01S 5/023
2011/0267023 A1* 11/2011 Muto .................... H01L 23/373
257/784
(Continued)

FOREIGN PATENT DOCUMENTS

CN 202434520 U 9/2012
CN 105099168 A 11/2015
(Continued)

OTHER PUBLICATIONS

An Office Action mailed by China National Intellectual Property Administration on Nov. 2, 2022, which corresponds to Chinese Patent Application No. 201980018426.0 and is related to U.S. Appl. No. 16/965,889; with English language translation.
(Continued)

*Primary Examiner* — Kinam Park
(74) *Attorney, Agent, or Firm* — Studebaker & Brackett PC

(57) ABSTRACT

A semiconductor module includes a sub-mount having a front surface, a back surface, side surfaces connecting the front surface and the back surface, a semiconductor element soldered onto the front surface of the sub-mount, and a block soldered onto the back surface of the sub-mount. The semiconductor element protrudes outward beyond a first side surface of the sub-mount, a concave portion is formed on each of a second side surface and a third side surface of the sub-mount perpendicular to the first side surface, the concave portion extending from the front surface of the sub-mount toward the back surface of the sub-mount, and
(Continued)

the concave portion is disposed to allow a projection of a collet to be held in the concave portion with the front surface of the sub-mount held by suction by the collet.

11 Claims, 14 Drawing Sheets

(51) Int. Cl.
    *H01S 5/02315*     (2021.01)
    *H01S 5/0237*     (2021.01)
    *H01S 5/02375*     (2021.01)
    *H01S 5/0239*     (2021.01)
    *H01S 5/024*     (2006.01)
    *H01L 33/00*     (2010.01)

(52) U.S. Cl.
    CPC .......... *H01S 5/0237* (2021.01); *H01S 5/0239* (2021.01); *H01S 5/02476* (2013.01); *H01L 33/005* (2013.01); *H01L 2933/0066* (2013.01)

(56) References Cited

U.S. PATENT DOCUMENTS

| | | | | |
|---|---|---|---|---|
| 2012/0195545 | A1* | 8/2012 | Yasuda | .................. G02B 6/428 |
| | | | | 438/66 |
| 2015/0044788 | A1* | 2/2015 | Okada | ............... H01L 21/67028 |
| | | | | 324/757.01 |
| 2017/0077674 | A1* | 3/2017 | Hagimoto | ............. H01S 5/3202 |

FOREIGN PATENT DOCUMENTS

| | | |
|---|---|---|
| JP | H04-315486 A | 11/1992 |
| JP | 2003-046181 A | 2/2003 |

OTHER PUBLICATIONS

International Search Report issued in PCT/JP2019/009904; mailed May 7, 2019.
An Office Action mailed by China National Intellectual Property Administration on Nov. 22, 2021, which corresponds to Chinese Patent Application No. 201980018426.0 and is related to U.S. Appl. No. 16/965,889; with English language translation.

* cited by examiner (a)

(b)

(a)

(b)

(a)

(b)

(a)

(b)

(a)

(b)

(a)

(b)

(a)

(b)

(a)

(b)

(a)

(b)

SEMICONDUCTOR MODULE AND METHOD OF MANUFACTURING SAME

TECHNICAL FIELD

The present invention relates to a semiconductor module and a method of manufacturing the same, and more particularly, to an optical semiconductor module used for optical communication and a method of manufacturing the same.

BACKGROUND ART

A transceiver having an optical semiconductor module built therein is an indispensable component for an optical communication system, and there has been a strong demand for reduction in size and cost of such a transceiver with an increase in demand.

In a process of manufacturing the optical semiconductor module, an optical semiconductor element soldered in advance to a sub-mount such as a ceramic substrate is held by suction by, for example, a pyramid collet and is fixed to a support such as a stem with solder. At this time, the sub-mount is scrubbed (rubbed) against the support in order to ensure that the solder wet-spreads all over the bonding surface and that the film thickness of the solder is made uniform. Further, the optical axis alignment between the optical semiconductor element and an external optical system is made by the pyramid collet.

The pyramid collet has a quadrangular concave portion at a distal end thereof and is configured to evacuate, with four side surfaces of the sub-mount in contact with an inner wall of the concave portion, air from the concave portion to hold the sub-mount by vacuum-suction. There has been proposed a structure where, in order to prevent the sub-mount from rubbing against the concave portion of the pyramid collet to damage a front surface of the sub-mount or prevent the periphery of the sub-mount from being chipped in the scrubbing process, a step is provided, for example, on the periphery of the sub-mount to prevent the concave portion of the pyramid collet from coming into contact with the front surface of the sub-mount (for example, see Patent Document 1).

PRIOR ART DOCUMENT

Patent Document

Patent Document 1: JP H04-315486 A

SUMMARY OF THE INVENTION

Problems to be Solved by the Invention

However, a structure where the sub-mount is reduced in size with a reduction in size of the optical semiconductor module, and the optical semiconductor element fixed onto the sub-mount protrudes beyond the periphery of the sub-mount has a problem that the pyramid collet having the concave portion formed therein comes into contact with the optical semiconductor element and fails to sufficiently hold the sub-mount by suction, or the optical semiconductor element is damaged.

On the other hand, a collet having a flat surface can hold the front surface of the sub-mount by suction, but has a problem that the position of the holding by suction is shifted, or the holding by suction is released in the scrubbing process.

It is therefore an object of the present invention to provide a semiconductor module that allows a sub-mount to be scrubbed with the sub-mount held by suction by a collet, even with a structure where an optical semiconductor element fixed onto the sub-mount protrudes beyond a periphery of the sub-mount or other structure.

Means for Solving the Problems

A semiconductor module according to an aspect of the present invention includes a first member, and a second member having a front surface, a back surface, side surfaces connecting the front surface and the back surface, the first member and the back surface being bonded together with a bonding material interposed between the first member and the back surface. In such a semiconductor module, the side surfaces includes a first side surface, and a second side surface and a third side surface arranged on both sides of the first side surface, a semiconductor element is provided on the first side surface, and a concave portion is formed on each of the second side surface and the third side surface, the concave portion extending from the front surface of the second member toward the back surface of the second member.

A semiconductor module according to another aspect of the present invention includes a first member, and a second member having a front surface, a back surface, side surfaces connecting the front surface and the back surface, the first member and the back surface being bonded together with a bonding material interposed between the first member and the back surface. In such a semiconductor module, the side surfaces includes a first side surface, and a second side surface and a third side surface arranged on both sides of the first side surface, a semiconductor element is provided on a connection area within the front surface of the second member, a concave portion is formed on each of the second side surface and the third side surface, the concave portion extending from the front surface of the second member toward the back surface of the second member, and the concave portion has an opening provided on the front surface of the second member, the opening being provided separately from the connection area and being smaller in width than the second side surface and the third side surface.

A method of manufacturing a semiconductor module according to yet another aspect of the present invention in which a second member having a semiconductor element mounted thereon is bonded to a first member includes causing a collet to hold a front surface of the second member by suction and to insert and hold a projection of the collet into at least two concave portions formed on the second member, placing the second member onto the first member with a bonding material interposed between the second member and the first member, and scrubbing while causing the collet to press the first member against the front surface of the second member.

A semiconductor module according to yet another aspect of the present invention includes a sub-mount having a front surface, a back surface, side surfaces connecting the front surface and the back surface, a semiconductor element soldered onto the front surface of the sub-mount, and a block soldered onto the back surface of the sub-mount. In such a semiconductor module, the semiconductor element protrudes outward beyond a first side surface of the sub-mount, a concave portion is formed on each of a second side surface and a third side surface of the sub-mount perpendicular to the first side surface, the concave portion extending from the front surface of the sub-mount toward the back surface of the sub-mount, and the concave portion is disposed to allow a projection of a collet to be held in the concave portion with the front surface of the sub-mount held by suction by the collet.

A semiconductor module according to yet another aspect of the present invention includes a sub-mount having a front surface, a back surface, side surfaces connecting the front surface and the back surface, a semiconductor element soldered onto a first side surface of the sub-mount, and a block soldered onto the back surface of the sub-mount. In such a semiconductor module, a concave portion is formed on each of a second side surface and a third side surface of the sub-mount perpendicular to the first side surface, the concave portion extending from the front surface of the sub-mount toward the back surface of the sub-mount, and the concave portion is disposed to allow a projection of a collet to be held in the concave portion with the front surface of the sub-mount held by suction by the collet.

A semiconductor module according to yet another aspect of the present invention includes a sub-mount having a front surface and a back surface, a semiconductor element soldered onto the front surface of the sub-mount, and a block having a front surface, a back surface, and side surfaces connecting the front surface and the back surface. In such a semiconductor module, the sub-mount is soldered onto a first side surface of the block, a concave portion is formed on each of a second side surface and a third side surface of the block perpendicular to the first side surface, the concave portion extending from the front surface of the block toward the back surface of the block, and the concave portion is disposed to allow a projection of a collet to be held in the concave portion with the front surface of the block held by suction by the collet.

A semiconductor module according to yet another aspect of the present invention includes a sub-mount having a front surface and a back surface, a semiconductor element soldered onto the front surface of the sub-mount, and a block having a front surface, a back surface, and side surfaces connecting the front surface and the back surface. In such a semiconductor module, the sub-mount is soldered onto the front surface of the block, the sub-mount protrudes outward beyond a first side surface of the block, a concave portion is formed on each of a second side surface and a third side surface of the block perpendicular to the first side surface, the concave portion extending from the front surface of the block toward the back surface of the block, and the concave portion is disposed to allow a projection of a collet to be held in the concave portion with the front surface of the block held by suction by the collet.

A method of manufacturing such a semiconductor module according to yet another aspect of the present invention includes soldering the semiconductor element to the sub-mount, causing the collet to hold the front surface of the sub-mount by suction and to insert and hold the projection of the collet into the concave portion of the sub-mount, melting solder on the front surface of the block and scrubbing while causing the collet to press the sub-mount against the front surface of the block, cooling the solder with the sub-mount held at a predetermined position by the collet and soldering the sub-mount onto the front surface of the block, and causing the collect to stop holding by suction and to remove the projection of the collet from the concave portion of the sub-mount.

A method of manufacturing such a semiconductor module according to yet another aspect of the present invention includes soldering the semiconductor element to the sub-mount, soldering the sub-mount to the block, causing the collet to hold the front surface of the block by suction and to insert and hold the projection of the collet into the concave portion of the block, melting solder on a front surface of a thermo-module and scrubbing while causing the collet to press the block against the front surface of the thermo-module, cooling the solder with the block held at a predetermined position by the collet and soldering the block onto the front surface of the thermo-module, and causing the collect to stop holding by suction and to remove the projection of the collet from the concave portion.

Effects of the Invention

The semiconductor module according to the present invention allows the collet to hold the sub-mount or the block by suction without coming into contact with the semiconductor laser chip or the like. Accordingly, the scrubbing allows the solder to reliably wet-spread all over the bonding surface and allows the film thickness of the solder to be uniform. Further, after the scrubbing, the collet is moved to a predetermined position and then cooled, allowing the bonding position to be accurately adjusted and particularly allowing the optical axis of the semiconductor laser chip to be accurately adjusted. Furthermore, since a fillet is also formed on the inner wall of the concave portion provided on the sub-mount or the block, it is possible to achieve solder bonding excellent in heat and shock resistance.

EMBODIMENTS OF THE INVENTION

Figure 1:
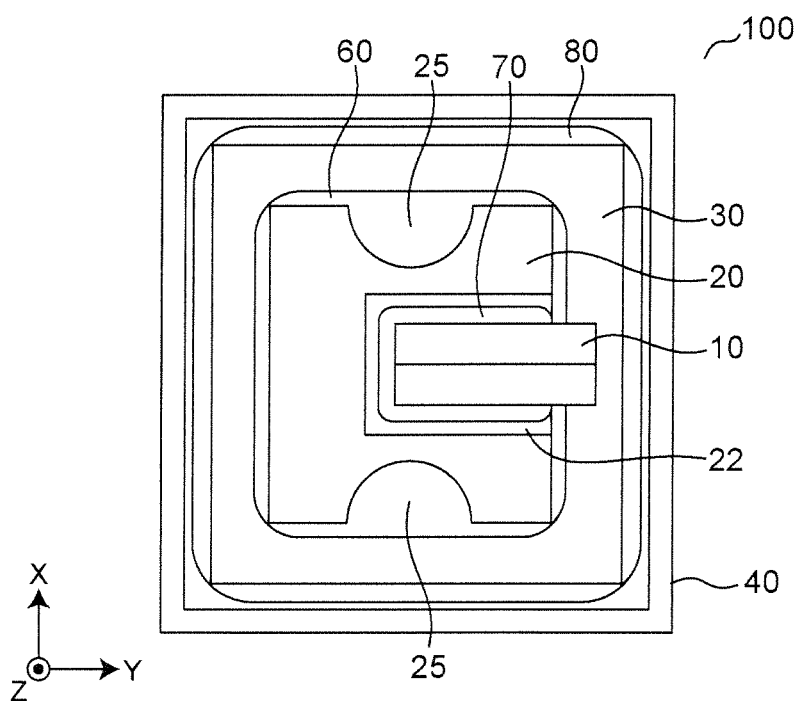
FIG. 1(*a*) is a plan view of an optical semiconductor module according to a first embodiment of the present invention, and FIG. 1(*b*) is a side view of the optical semiconductor module.
Figure 1:
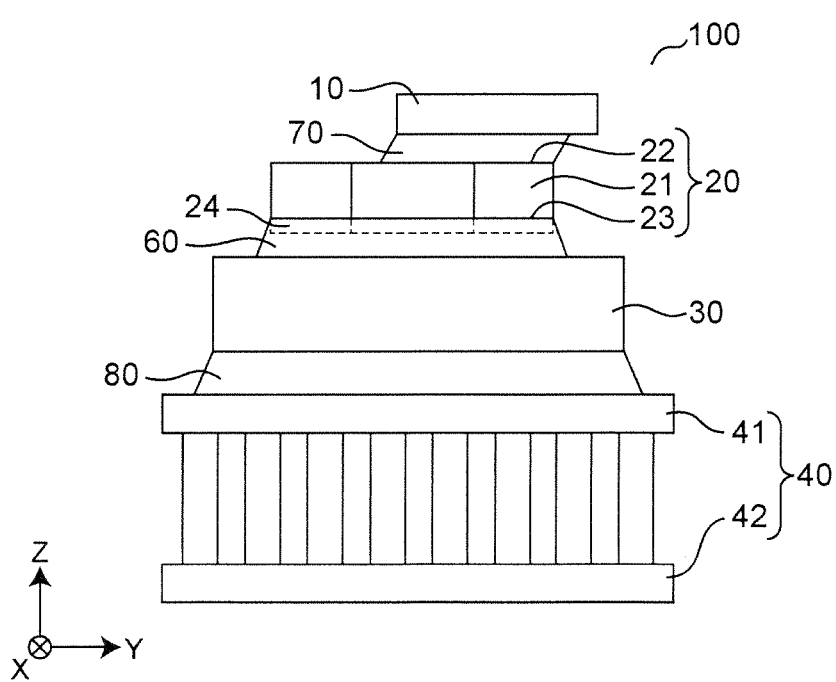

A description will be given below of optical semiconductor modules according to embodiments of the present invention with reference to the drawings. In the drawings, the same or corresponding parts are denoted by the same reference numerals. Further, in order to avoid the description being unnecessarily redundant and to make the description easily understood, detailed description of already well-known matters and redundant description of substantially the same configuration may be omitted. Note that the following description and the accompanying drawings are not intended to limit the subject matter of the claims.

The size or scale of each corresponding component is not uniform among the drawings. For example, the size or scale of the same component may be different between a drawing in which the component is partly modified and a drawing in which the component is not modified. Further, for actual implementation of the optical semiconductor module, it is required that the optical semiconductor module further include some components, but, for the purpose of simplifying the description, only necessary parts of the description will be given, and the other parts will be omitted.

Note that a description will be given below of an optical semiconductor module using a semiconductor laser chip as an example; however, the present invention is applicable to not only such an optical semiconductor module but also a semiconductor module having a similar problem such as a power semiconductor module and a semiconductor module that handles a normal current.

First Embodiment

FIG. 1(a) is a plan view of an optical semiconductor module, denoted by 100 as a whole, according to a first embodiment of the present invention, and FIG. 1(b) is a side view of the optical semiconductor module. The optical semiconductor module 100 has a block 30. The block 30 is made of a material that conducts heat and electricity well, such as metal of Cu, Fe, or Al, or a product resulting from coating an insulator such as ceramic or resin with metal. The block 30 has a front surface and a back surface orthogonal to a Z axis. The block 30 may have a cuboid shape, a plate shape, or the like, and the shape of the block 30 is not limited to any particular shape.

A sub-mount 20 is bonded to the front surface of the block 30 with solder 60. A semiconductor laser chip 10 is bonded to a front surface of the sub-mount 20 with solder 70.

On the other hand, a thermo-module 40 is bonded to the back surface of the block 30 with solder 80.

The thermo-module 40 has a heat absorber 41 and a heat radiator 42 and is configured to conduct heat received by the heat absorber 41 to the heat radiator 42 through a Peltier device and release the heat from the heat radiator 42 to, for example, a metal stem or the like (not shown). As described above, the temperature of the semiconductor laser chip 10 is regulated by the thermo-module 40, allowing stable operation.

The sub-mount 20 includes a ceramic substrate 21, a conductor pattern 22 provided on a front surface of the ceramic substrate 21, and a conductor pattern 23 provided on a back surface of the ceramic substrate 21. The ceramic substrate 21 is preferably made of an electrical insulator such as a material that is high in heat conductivity in order to cool the semiconductor laser chip 10 effectively. For example, a ceramic substrate made of AlN, $Al_2O_3$, or the like having a thickness of 0.3 mm is used.

The conductor patterns 22, 23 are preferably made of the same material. The semiconductor laser chip 10 is bonded to the conductor pattern 22 with the solder 70 with a part, on a laser output side, of the semiconductor laser chip 10 protruding beyond a periphery of the sub-mount 20. Further, the conductor pattern 22 is electrically connected to the semiconductor laser chip 10 and the like by an Au wire or the like. The conductor pattern 22 also acts as a wiring member for electrically connecting the semiconductor laser chip 10 and an external circuit (not shown); therefore, it is preferable that the conductor pattern 22 be made of metal that is low in electrical resistance. The conductor patterns 22, 23 are generally formed through metallization with Au or the like having a thickness of 3.0 μm or less, for example. Note that the conductor patterns 22, 23 are thin films; therefore, their thicknesses are not shown in FIG. 1(b) and the like.

On two side surfaces of the four side surfaces of the ceramic substrate 21, the two side surfaces being orthogonal to a direction in which the semiconductor laser chip 10 protrudes (orthogonal to the X axis in FIG. 1), concave portions 25 are formed. The concave portions 25 have a semi-cylindrical shape having a semicircular XY cross section, and this cross sectional shape is unchanged in a Z-axis direction.

In FIG. 1, the two concave portions 25 are arranged on opposite sides of the ceramic substrate 21; however, different layouts are possible as described later.

A conductor pattern 24 is formed all around the conductor pattern 23 on side surfaces of the sub-mount 20 that are in contact with the conductor pattern 23, including side surfaces of the concave portions 25, the conductor pattern 24 having a height of 0.1 mm from a contact position with the conductor pattern 23. This causes the solder 60 to wet up the conductor pattern 24 to form a fillet, increasing bonding strength with respect to the block 30.

The semiconductor laser chip 10 is fixed with the solder 70 onto the conductor pattern 22 provided on the front surface of the ceramic substrate 21. The semiconductor laser chip 10 is fixed such that a part of the semiconductor laser chip 10, for example, a part on the laser output side, protrudes outward beyond the periphery of the sub-mount 20 when viewed along the Z axis, as shown in FIG. 1, for example. The semiconductor laser chip 10 is, for example, a laser diode (LD) or a photo diode (PD) and is configured to convert an electric signal into an optical signal or vice versa.

Note that, in the optical semiconductor module 100 shown in FIG. 1, other components such as a capacitor, a metal stem, a thermostat, and wires are not shown.

With the solder 60, the block 30 is bonded to the conductor pattern 23 formed on the back surface of the sub-mount 20. In the process of bonding the sub-mount 20 to the block 30 with the solder 60, the block 30 is already bonded to the thermo-module 40 with the solder 80. Therefore, it is preferable that the solder 60 be made of metal that is lower in melting point than the solder 80 and high in heat conductivity so as to prevent the solder 80 from being melted again at the time of the bonding with the solder 60. In general, as a solder material, an alloy containing Sn, Pb, Au, Ag, Cu, Zn, Ni, Sb, Bi, In, Ge, or the like and having a melting point of less than 450° C. is used; however, it is preferable that an alloy mainly containing Sn, Ag, Cu, or the like and having a melting point of less than 250° C. be used as the solder 60. Further, the thickness of the solder 60 is preferably equal to or less than 0.1 mm in order to ensure good heat dissipation. To melt the solder 60 for soldering, for example, the back surface of the thermo-module 40 is entirely heated by a hot plate.

With the solder 70, the semiconductor laser chip 10 is bonded to the conductor pattern 22 formed on the upper surface of the sub-mount 20. In the process of bonding the semiconductor laser chip 10 to the sub-mount 20 with the solder 70, the sub-mount 20 has not been bonded to the block 30 yet. Therefore, it is preferable that the solder 70 be made of metal that is higher in melting point than the solder 60 and high in heat conductivity so as to prevent the solder 70 from being melted again at the time of the bonding with the solder 60. It is preferable that the solder 70 be made of an alloy mainly containing Au, Sn, Ge, or the like and having a melting point of 250° C. or higher. Further, it is preferable that the thickness of the solder 70 be equal to or less than 0.1 mm, like the solder 60, in order to obtain good heat dissipation.

With the solder 80, the front surface of the heat absorber 41 of the thermo-module 40 and the back surface of the block 30 are bonded to each other. After the block 30 is bonded to the heat absorber 41 with the solder 80, the sub-mount 20 to which the semiconductor laser chip 10 is bonded with the solder 70 is bonded to the front surface of the block 30 with the solder 60. Therefore, it is preferable that the solder 80 be made of a metal that is higher in melting point than the solder 60 and high in heat conductivity so as to prevent the solder 80 from being melted again at the time of the bonding with the solder 60. It is preferable that the solder 80 be made of an alloy mainly containing Au, Sn, Ge, or the like and having a melting point of 250° C. or higher. In addition, it is preferable that the alloy have a melting point lower than a heat-resistant temperature of the thermo-module 40, for example, a melting point of less than 350° C.

In the process of soldering the sub-mount 20 to the front surface of the block 30, the sub-mount 20 is scrubbed against the front surface of the block 30 so as to reliably cause the solder to wet-spread all over the members and to prevent the sub-mount 20 from being tilted due to a deviation in film thickness of the solder. In addition, accurate positioning is required to align an optical axis between the semiconductor laser chip 10 pre-fixed to the sub-mount 20 and an external optical system (not shown). For this reason, as shown in the cross-sectional view of FIG. 2, transfer and soldering in a conventional manner are performed using a collet 500 that has a quadrangular pyramid concave portion 501 provided at a distal end of the collet 500 and a flow path 502 communicating with a vacuum source and extending to the concave portion 501, with the sub-mount 20 held by suction by the collet 500 to bring their four sides into contact with an inner wall of the concave portion 501.

Figure 2:
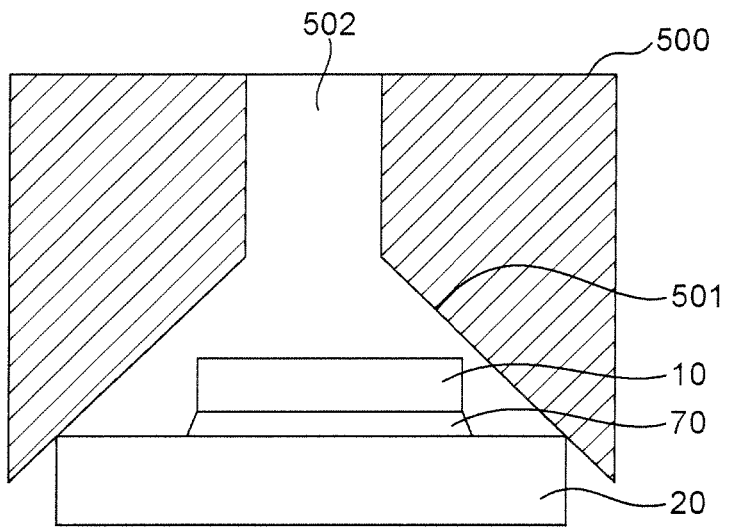
FIG. 2 is a schematic diagram showing a case where a collet holds a conventional sub-mount by suction.

Moving the collet 500 in an X-Y plane of FIG. 2 with the sub-mount 20 pressed against the block 30 by the collet 500 causes the sub-mount 20 to be scrubbed. Since the sub-mount 20 pressed by the collet 500 is not displaced in the collet 500 even when the sub-mount 20 is scrubbed, it is possible to accurately position the sub-mount 20 by moving the collet 500 to a predetermined position and cooling after the scrubbing.

However, with a reduction in size of optical semiconductor modules, the sub-mount 20 has become smaller accordingly, and, for example, as shown in FIG. 1, the semiconductor laser chip 10 may be fixed to the front surface of the sub-mount 20 with a part of the semiconductor laser chip 10 protruding outward beyond the periphery of the sub-mount 20. In such a case, the use of the conventional collet 500 has a problem that the concave portion 501 of the collet 500 comes into contact with the semiconductor laser chip 10 protruding beyond the periphery of the sub-mount 20, which causes the semiconductor laser chip 10 to be damaged or come off.

In order to solve such a problem, according to the first embodiment of the present invention, on two side surfaces of the four side surfaces of the sub-mount 20, the two side surfaces orthogonal to the direction in which the semiconductor laser chip 10 protrudes, cylindrical concave portions 25 having a semicircular XY cross section are formed so as to allow a collet to hold the sub-mount using the concave portions 25.

Figure 3:
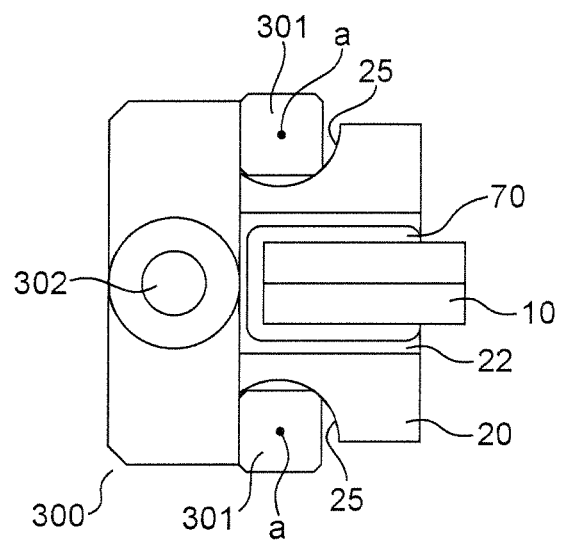
FIG. 3(*a*) is a plan view of a case where a collet holds, by suction, a sub-mount according to the first embodiment of the present invention, and FIG. 3(*b*) is a side view of the case.
Figure 3:
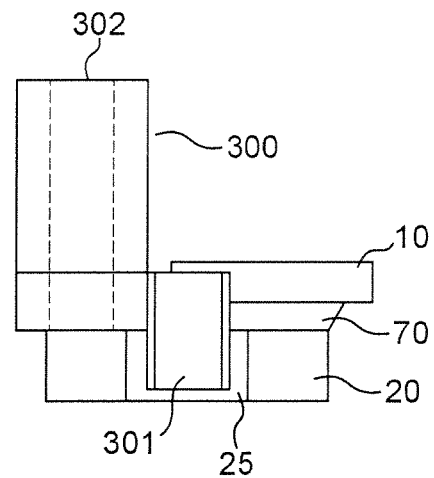

Specifically, as shown in FIG. 3, a collet 300 includes two projections 301 and a flow path 302 communicating with a vacuum source. The two projections 301 have a quadrangular prism shape. Causing the vacuum source to evacuate air from the flow path 302 with a bottom surface of the collet 300 in contact with the front surface of the sub-mount 20 causes the sub-mount 20 to be held in the collet 300 by vacuum-suction. The holding by suction is performed with the collet 300 in contact with a part of the front surface of the sub-mount 20 where the semiconductor laser chip 10 is not soldered. Further, in this state, the projections 301 are inserted into the concave portions 25 with the projections 301 in contact with the side surfaces of the concave portions 25. This causes the sub-mount 20 to be held in the collet 300 and prevents, even when the sub-mount 20 is scrubbed, the sub-mount 20 from coming off from or being displaced relative to the collet 300.

As shown in FIG. 3, it is preferable that, with the sub-mount 20 held by suction by the collet 300, a center axis of each of the projections 301 having a quadrangular prism shape coincide with a center axis (denoted by a in FIG. 3) of a corresponding one of the concave portions 25 of the sub-mount 20.

Causing the collet 300 to hold the sub-mount 20 by suction allows the collet 300 to hold the sub-mount 20 by suction without coming into contact with the semiconductor laser chip 10, making it possible to prevent the semiconductor laser chip 10 from being damaged or coming off.

In a case where the sub-mount 20 is held by suction by the collet 300, when the semiconductor laser chip 10 or the solder 70 overlaps openings of the concave portions 25, inserting the projections 301 of the collet 300 into the concave portions 25 brings the projections 301 into contact with the semiconductor laser chip 10 and in turn damages the semiconductor laser chip 10. For this reason, it is necessary to design the conductor pattern 22 to which the semiconductor laser chip 10 is bonded with the solder 70 so as to prevent the conductor pattern 22 from being located at a position where the openings of the concave portions 25 are present or a position where the collet 300 comes into contact with the sub-mount 20. For example, in order to prevent the projections 301 of the collet 300 from coming into contact with the semiconductor laser chip 10, it is preferable that, as shown in FIG. 1, the concave portions 25 are formed in the side surfaces perpendicular to the side surfaces extending in the direction in which the semiconductor laser chip 10 emits laser.

Further, in the X-Y plane view as shown in FIG. 3 (FIG. 3(a)), a length from a center to each corner of the projections 301 is designed to be equal to a radius of the concave portions 25, so that, when sub-mount 20 is held by suction by the collet 300, the corners of the projections 301 come into contact with inner walls of the concave portions 25, and the sub-mount 20 is held in the collet 300 accordingly. When the collet 300 is moved in the X-Y plane of FIG. 3 with the sub-mount 20 pressed against the block 30 by the collet 300, the sub-mount 20 is moved together with the collet 300 to be scrubbed, with the sub-mount 20 held by the projections 301 inserted in the concave portions 25. No displacement occurs between the collet 300 and the sub-mount 20; therefore, it is possible to accurately position the sub-mount 20 by moving the collet 300 to a predetermined position and cooling after the scrubbing.

Further, in the X-Y plane, the concave portions 25 of the sub-mount 20 have a semicircular shape, and the projections 301 of the collet 300 have a quadrangle shape, causing only the four corners of each of the projections 301 to come into contact with the concave portions 25, which in turn makes it possible to easily insert/remove the projections 301 into/from the concave portions 25 without applying large friction to the concave portions 25 during insertion/removal.

Furthermore, in the X-Y plane, the concave portions 25 of the sub-mount 20 have a distinctive shape such as a semicircular shape, allowing the position of the sub-mount 20 to be easily recognized by a camera. Therefore, in a manufacturing process, it is possible to accurately position the collet 300 and position the sub-mount 20 when soldering the sub-mount 20 to the block 30.

During the soldering, excess solder 60 is let outside the sub-mount 20 by scrubbing. The solder 60 let outside the sub-mount 20 wet-spreads over the conductor pattern 22 around the sub-mount 20 and wets up the conductor pattern 24 formed on the side surfaces of the sub-mount 20 that are in contact with the conductor pattern 23 along the periphery of the conductor pattern 22. Since the conductor pattern 24 is also present in the concave portions 25, a fillet is formed at positions including the inner walls of the concave portions 25. As a result, as compared to a conventional soldering of the sub-mount, it is possible to ensure soldering excellent in heat and shock resistance and to obtain the optical semiconductor module 100 having high reliability.

In addition, since the solder 60 wets up the conductor pattern 24, even when the amount of supplied solder is small and the solder is accordingly prevented from being let out to the periphery of the sub-mount 20 by scrubbing, it is possible to visually inspect whether the solder wets up in the concave portions 25, and the sub-mount 20 is soldered to the entire surface of the conductor pattern 23.

As described above, in the optical semiconductor module 100, the concave portions 25 of the sub-mount 20 are provided on the two opposite side surfaces of the sub-mount such that the centers of the semicircular shapes are positioned at the same Y coordinate (see FIG. 3). However, as long as the sub-mount 20 can be held by suction by the collet, the concave portions 25 may have a different layout and shape as shown below.

Figure 4A:
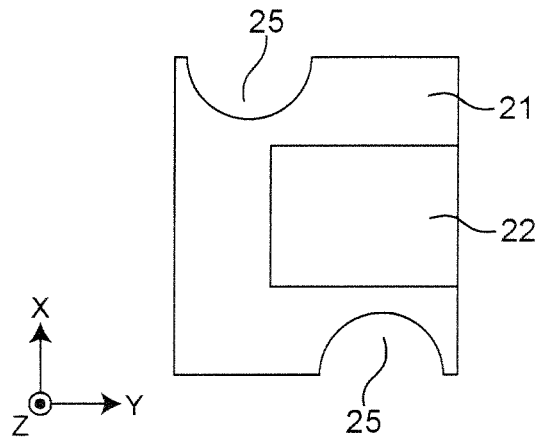
FIG. 4A is a plan view of another sub-mount used in the optical semiconductor module according to the first embodiment of the present invention.
Figure 4B:
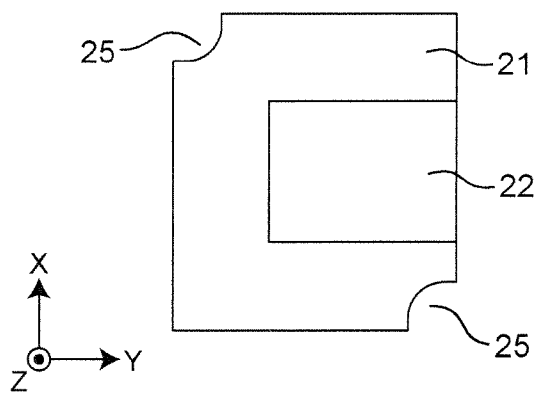
FIG. 4B is a plan view of yet another sub-mount used in the optical semiconductor module according to the first embodiment of the present invention.
Figure 4C:
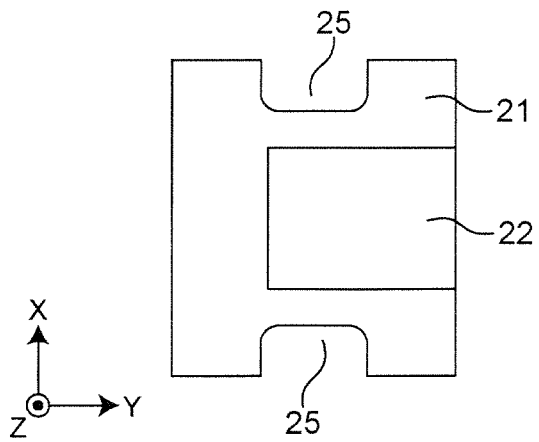
FIG. 4C is a plan view of yet another sub-mount used in the optical semiconductor module according to the first embodiment of the present invention.

FIGS. 4A to 4F are plan views of other sub-mounts 20 according to the first embodiment of the present invention. In FIGS. 4A to 4F, the same reference numerals as those shown in FIG. 3 denote the same or corresponding parts. For example, as shown in FIG. 4A, the concave portions 25 may be provided at two positions different in Y-coordinate on two opposite side surfaces, or alternatively, the concave portions 25 may be provided at diagonally opposite corners as shown in FIG. 4B. Further, as shown in FIG. 4C, the shape of the concave portions 25 in the X-Y plane may be a quadrangular shape having curved corners.

Figure 4D:
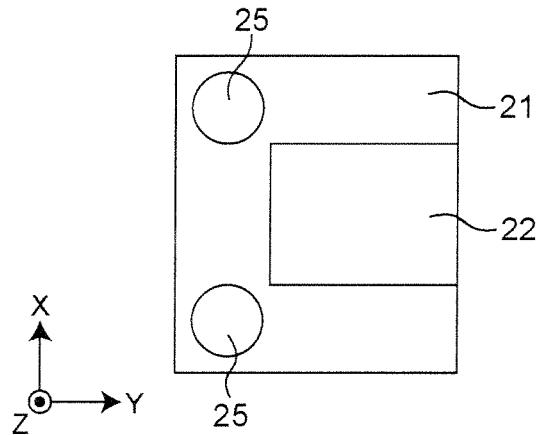
FIG. 4D is a plan view of yet another sub-mount used in the optical semiconductor module according to the first embodiment of the present invention.

Further, as shown in FIG. 4D, the concave portions 25 may be through holes formed through the sub-mount 20. In FIG. 4D, the through holes have a cylindrical shape, but may have a quadrangular prism shape or a polygonal prism shape.

Figure 4E:
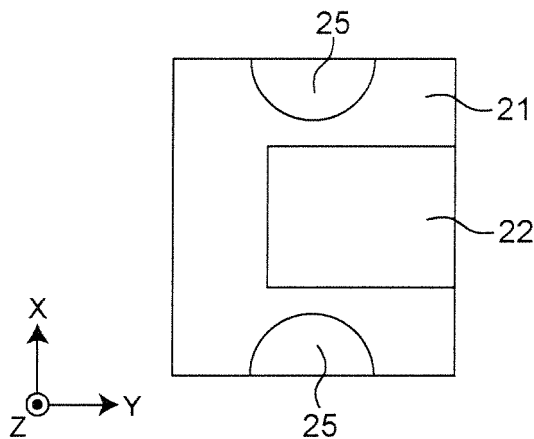
FIG. 4E is a plan view of yet another sub-mount used in the optical semiconductor module according to the first embodiment of the present invention.

Furthermore, in FIGS. 4A to 4D, the concave portions 25 extend through the sub-mount 20 from the front surface to the back surface, or alternatively, as shown in FIG. 4E, the concave portions 25 extending from the front surface of the sub-mount 20 need not reach the back surface. The concave portions 25 shown in FIGS. 4A to 4D may have such a bottomed structure.

Figure 4F:
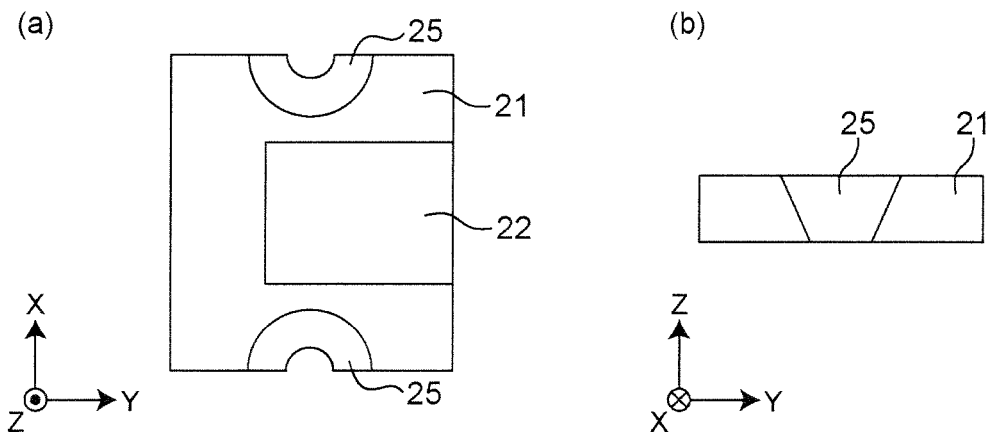
FIG. 4F(a) is a plan view of yet another sub-mount used in the optical semiconductor module according to the first embodiment of the present invention, and FIG. 4F(b) is a side view of the sub-mount when viewed along an X axis.

Further, in FIGS. 4A to 4E, the cross section of the concave portions 25 in the X-Y plane is unchanged in the Z-axis direction; however, as shown in FIG. 4F, the inner walls of the concave portions 25 may be tapered such that the cross section of the concave portions 25 in the X-Y plane becomes gradually smaller downward. Such a tapered shape causes, even with each of the projections 301 of the collet 300 and a corresponding one of the concave portions 25 of the sub-mount 20 slightly misaligned with each other when inserting the projections 301 into the concave portions 25, the projections 301 to be guided along the inner walls of the concave portions 25 to eliminate the misalignment. In this case, it is preferable that lower ends of the concave portions 25 be fixed in contact with the inner walls of the concave portions 25 with the bottom surface of the collet 300 in contact with the upper surface of the sub-mount 20.

Figure 5:
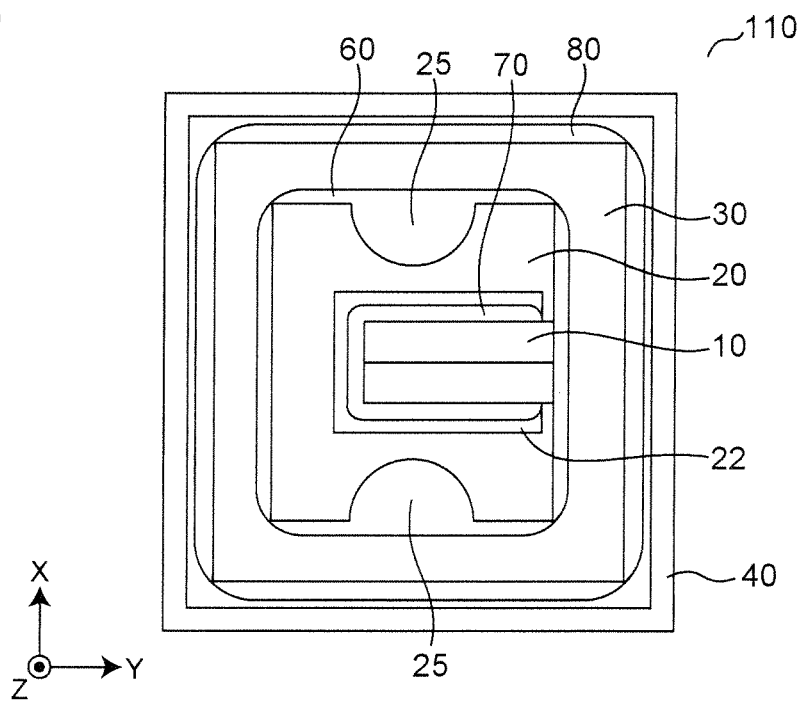
FIG. 5(*a*) is a plan view of another optical semiconductor module according to the first embodiment of the present invention, and FIG. 5(*b*) is a side view of the optical semiconductor module.
Figure 5:
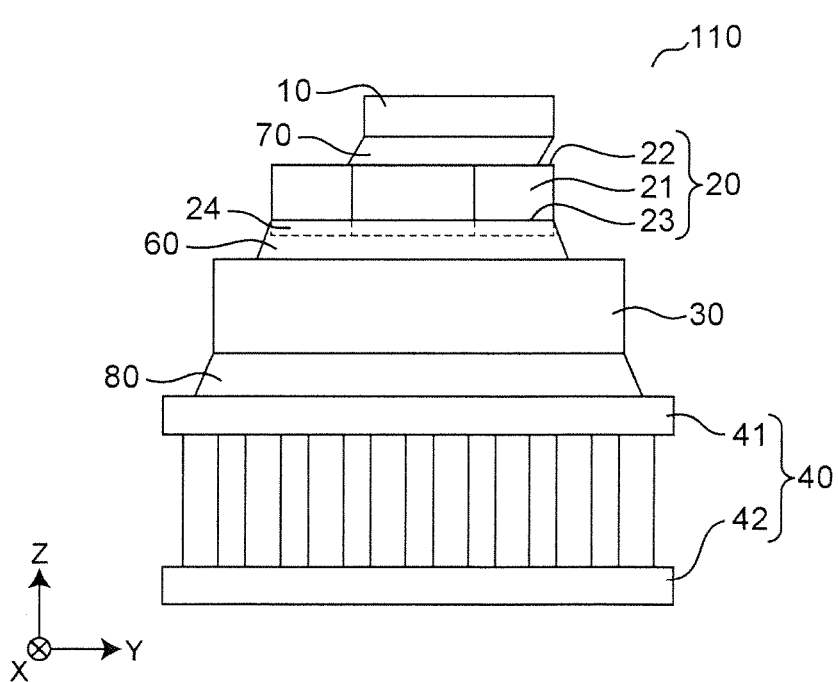

Further, in FIG. 1, the semiconductor laser chip 10 and the sub-mount 20 are bonded to each other with a part, on the laser output side, of the semiconductor laser chip 10 protrudes outward beyond the periphery of the sub-mount 20; however, the type and bonding position of the semiconductor laser chip 10 are not limited to those described above. For example, as shown in FIG. 5, the present invention is applicable to a structure where, even with the semiconductor laser chip 10 not protruding beyond the periphery of the sub-mount 20, when the sub-mount 20 is held by suction by the conventional collet 500, the inner wall of the collet 500 comes into contact with the sub-mount 20. FIG. 5(a) is a plan view of another optical semiconductor module, denoted by 110 as a whole, according to the first embodiment of the present invention, and FIG. 5(b) is a side view of the optical semiconductor module. In FIG. 5, the same reference numerals as those in FIG. 1 denote the same or corresponding parts.

In the optical semiconductor module 110, the semiconductor laser chip 10 is structured not to protrude outward beyond the periphery of the sub-mount 20; however, for example, the inner wall of the concave portion 501 of the pyramid collet comes into contact with the semiconductor laser chip 10 when the sub-mount 20 is held by suction because the semiconductor laser chip 10 is thicker, for example. In such a case, the collet 300 shown in FIG. 3 can hold the sub-mount 20 by suction without coming into contact with the semiconductor laser chip 10.

In the optical semiconductor module 110, as in the optical semiconductor module 100 described above, semi-cylindrical concave portions 25 are provided on two opposite side surfaces. The bottom surface of the collet 300 comes into contact with the upper surface of the sub-mount 20 (the left side of the semiconductor laser chip 10 in FIG. 5) to hold the sub-mount 20 by suction. In this state, the projections 301 of the collet 300 are inserted into the concave portions 25 of the sub-mount 20 to hold the sub-mount 20 in the collet 300.

Figure 6:
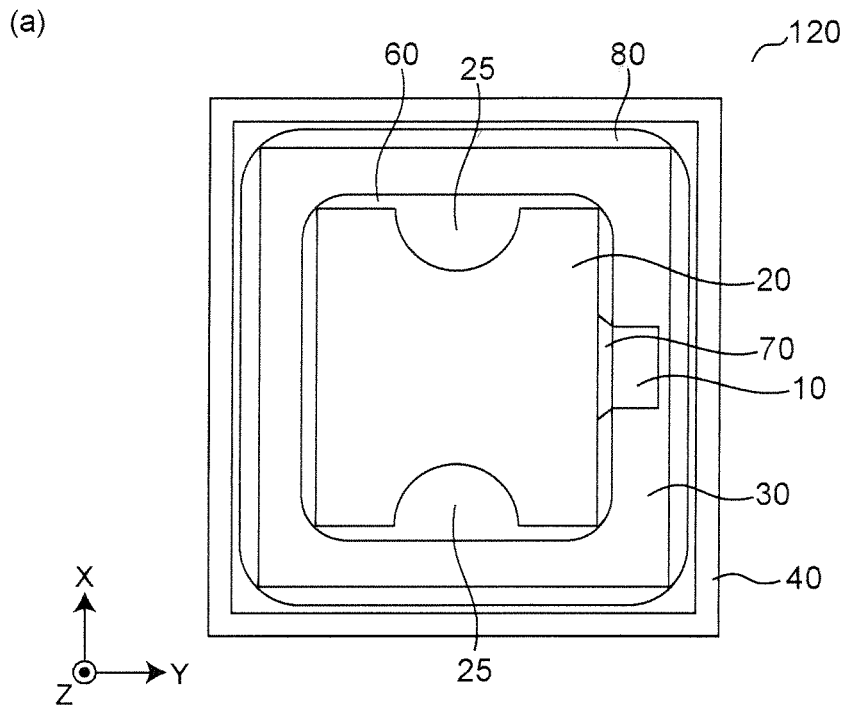
FIG. 6(*a*) is a plan view of yet another optical semiconductor module according to the first embodiment of the present invention, and FIG. 6(*b*) is a side view of the optical semiconductor module.
Figure 6:
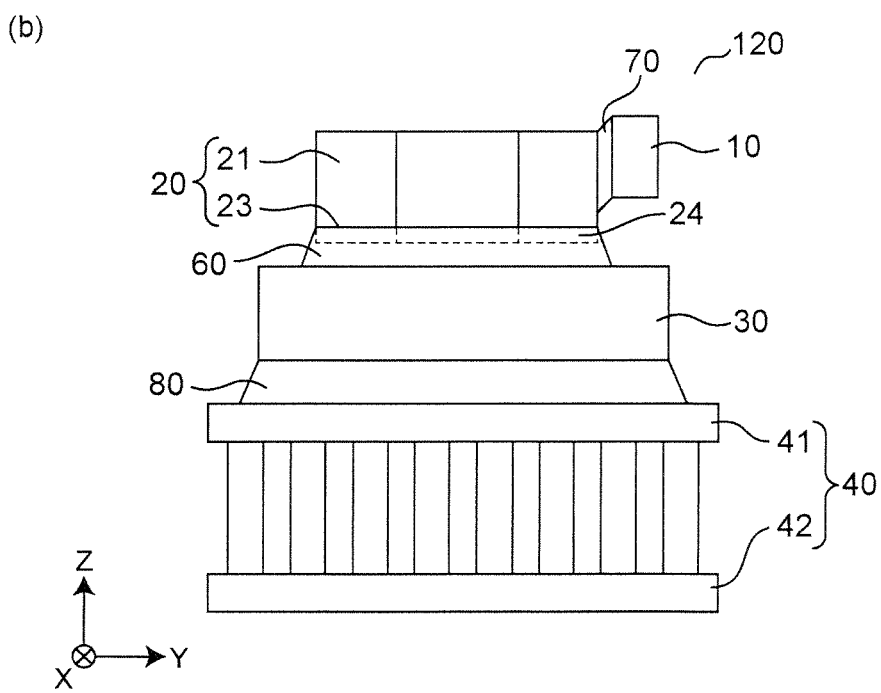

FIG. 6(a) is a plan view of yet another optical semiconductor module, denoted by 120 as a whole, according to the first embodiment of the present invention, and FIG. 6(b) is a side view of the optical semiconductor module. In FIG. 6, the same reference numerals as those in FIG. 1 denote the same or corresponding parts.

In the optical semiconductor module 120, the semiconductor laser chip 10 is bonded to one side surface of the sub-mount 20 with the solder 70. The other structure is the same as that of the optical semiconductor module 100, and semi-cylindrical concave portions 25 are provided on two opposite side surfaces perpendicular to a side surface to which the semiconductor laser chip 10 is fixed. The bottom surface of the collet 300 comes into contact with the upper surface of the sub-mount 20 to hold the sub-mount 20 by suction. In this state, the projections 301 of the collet 300 are inserted into the concave portions 25 of the sub-mount 20 to hold the sub-mount 20 in the collet 300.

As described above, the optical semiconductor modules 100, 110, and 120 according to the first embodiment of the present invention allow the sub-mount 20 to be held by suction without causing the collet 300 to come into contact with the semiconductor laser chip 10 even with a structure where a part of the semiconductor laser chip 10 protrudes beyond the periphery of the sub-mount 20 that causes the conventional pyramid collet to come into contact with the semiconductor laser chip 10. Further, the sub-mount 20 has the concave portions 25 on the opposite side surfaces of the sub-mount 20 and comes into contact with the projections 301 of the collet 300 to be held, so that it is possible to scrub, when the sub-mount 20 is soldered, the sub-mount 20 on the block 30 without causing the holding by suction of the sub-mount 20 to be released or the position of the holding by suction to be shifted. This allows the solder to reliably wet-spread all over the bonding surface and allows the film thickness of the solder to be uniform. After the scrubbing, the collet is moved to a predetermined position and cooled, allowing accurate positioning of the sub-mount 20 and accurate optical axis alignment of the semiconductor laser chip 10 mounted on the sub-mount 20. In addition, since a fillet is formed at portions including the inner walls of the concave portions 25, it is possible to ensure soldering excellent in heat and shock resistance.

Such a structure allows an area of the front surface of the sub-mount 20 required for bonding to the semiconductor laser chip 10 to be reduced and allows the size of the sub-mount 20 and the like to be reduced, which in turn makes it possible to reduce the volume of the material. As a result, the size and cost of the optical semiconductor module can be reduced.

Second Embodiment

Figure 7:
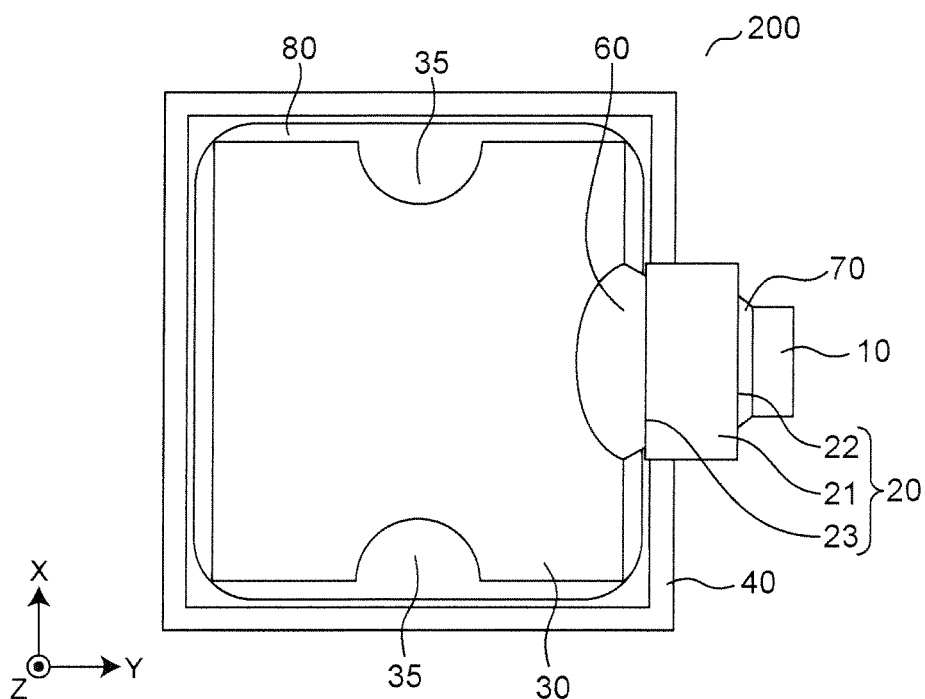
FIG. 7(a) is a plan view of an optical semiconductor module according to a second embodiment of the present invention.
FIG. 7(b) is a side view of the optical semiconductor module.
Figure 7:
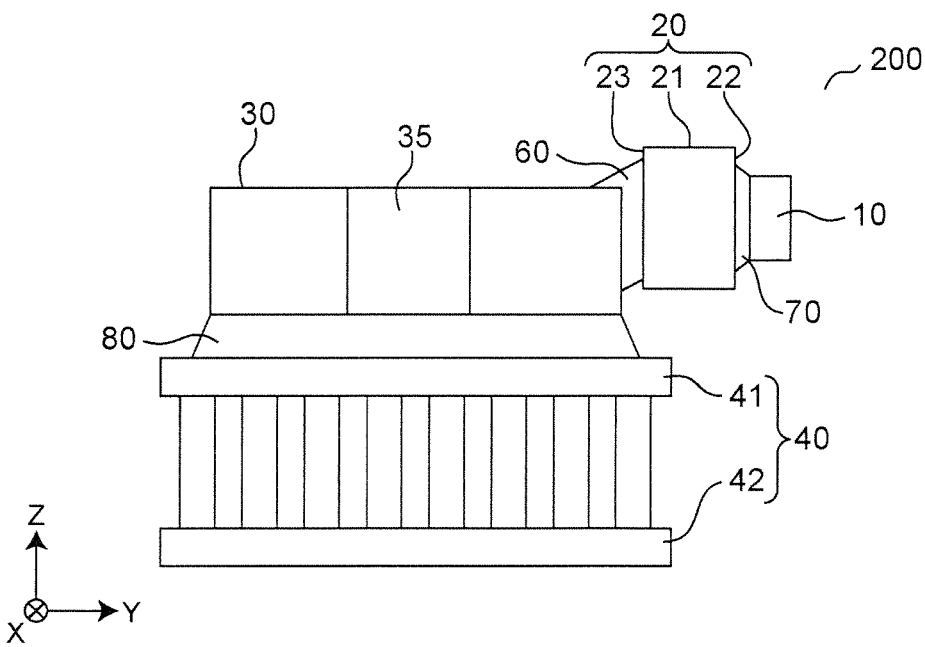

FIG. 7(a) is a plan view of an optical semiconductor module, denoted by 200 as a whole, according to a second embodiment of the present invention, and FIG. 7(b) is a side view of the optical semiconductor module. In FIG. 7, the same reference numerals as those in FIG. 1 denote the same or corresponding parts.

In the optical semiconductor module 200, the sub-mount 20 to which the semiconductor laser chip 10 is fixed is bonded to one side surface of the block 30 with the solder 60. The sub-mount 20 is provided with no concave portion, and, instead, the block 30 is provided with concave portions 35 on side surfaces of the block 30. The other structure is the same as that of the optical semiconductor module 100. Herein, a description will be given mainly of differences from the optical semiconductor module 100, and no description will be given of the same parts.

In the optical semiconductor module 200 according to the second embodiment of the present invention, the semiconductor laser chip 10 is bonded to the sub-mount 20 with the solder 70, and the sub-mount 20 is fixed to a side surface of the block 30 with the solder 60. The front surface of the sub-mount 20 is located orthogonal to a Y axis.

Furthermore, the sub-mount 20 has no concave portion, and, instead, the block 30 has the concave portions 35 having a semi-cylindrical shape formed on the side surfaces of the block 30. The concave portions 35 are arranged on the two opposite side surfaces perpendicular to the side surface to which the sub-mount 20 is fixed. The block 30 is fixed to the front surface of the heat absorber 41 of the thermo-module 40 with the solder 80.

According to the second embodiment, the above-described collet 300 is used, with the collet 300 in contact with the front surface of the block 30, to cause the vacuum source to evacuate air from the flow path 302 to hold the front surface of the block 30 by vacuum-suction. At this time, the two projections 301 are inserted into the concave portions 35 formed on the side surfaces of the block 30 to hold the block 30. It is preferable that the center axis of each of the projections 301 having a quadrangular prism shape of the collet 300 coincide with the center axis of a corresponding one of the concave portions 35 of the block 30. The size of the collet 300, specifically, the size, interval, layout, and the like of the projections 301 having a quadrangular prism are suitably designed such that the collet 300 can hold the block 30.

With the block 30 held by suction by the collet 300, the block 30 is bonded onto the heat absorber 41 of the thermo-module 40 with the solder 80. At this time, with the block 30 held by suction by the collet 300, the block 30 is moved in the X-Y plane to be scrubbed while being pressed against the front surface of the thermo-module 40, allowing the solder to reliably wet-spread all over the front surface of the thermo-module 40 and allowing the film thickness of the solder to be uniform to prevent the block 30 from being tilted.

Plating, sputtering, vapor deposition, or the like is applied so as to cause the solder such as Au, Ni, Cu, or Sn to wet-spread over the front surface of the block 30 that is soldered to the thermo-module 40 and the side surfaces (including the inner walls of the concave portions 35), causing a fillet to be formed on the side surfaces including the inner walls of the concave portions 35, which in turn makes it possible to ensure soldering excellent in heat and shock resistance. Note that as long as a material over which the solder wet-spreads is used as the material of the block 30, a fillet is formed without the application of plating, sputtering, vapor deposition, or the like.

As described above, in the process of causing the collet 300 to hold the block 30 by suction, the collet 300 does not come into contact with either the sub-mount 20 fixed to the side surface of the block 30 or the semiconductor laser chip 10, making it possible to prevent the semiconductor laser chip 10 and the like from coming off or being damaged.

Further, as in the first embodiment, the length from the center to each corner of the projections 301 of the collet 300 is designed to be equal to the radius of the semi-cylindrical concave portions 35 in the X-Y plane, allowing the block 30 to be held with the corners of the projections 301 of the collet 300 in contact with the inner walls of the concave portions 35. Accordingly, the collet 300 is prevented from being displaced, and the collet 300 is moved to a predetermined position and cooled after the scrubbing, so that the position of the block 30 can be accurately adjusted.

In addition, the concave portions 35 of the block 30 has a semi-cylindrical shape, and the projections 301 of the collet 300 has a quadrangular prism shape, causing only the four corners of each of the projections 301 to come into contact with the concave portions 35, which in turn makes it possible to insert and remove the projections 301 of the collet 300 into and from the block 30 without applying large friction during insertion and removal.

According to the second embodiment, the concave portions 35 having a semicylindrical shape are arranged on two opposite side surfaces of the block 30 so as to align their center axes on the same Y coordinate (FIG. 7); however, as long as the block 30 can be held by suction by the collet, the two concave portions 35 may have a different layout and shape as in the first embodiment.

Figure 8A:
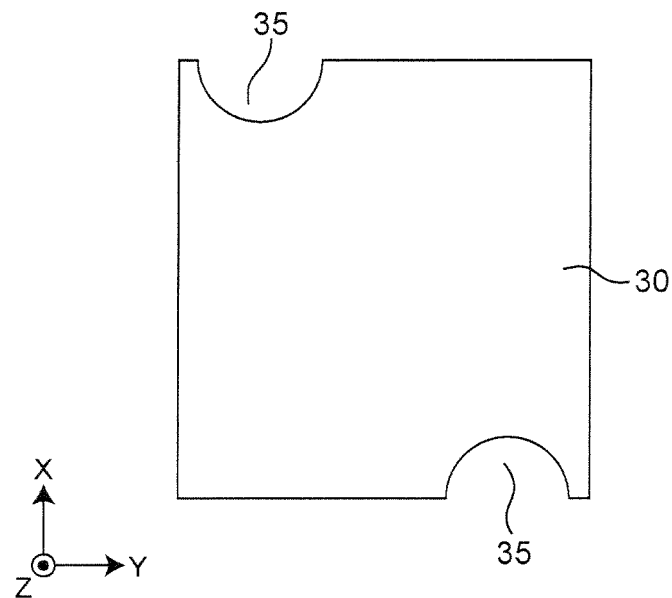
FIG. 8A is a plan view of another block used in the optical semiconductor module according to the second embodiment of the present invention.
Figure 8B:
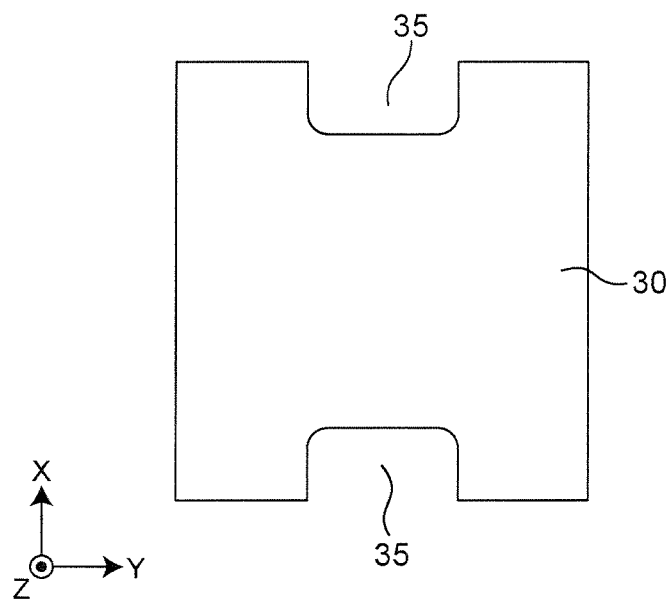
FIG. 8B is a plan view of yet another block used in the optical semiconductor module according to the second embodiment of the present invention.

FIGS. 8A to 8E are plan views of other blocks 30 according to the second embodiment of the present invention. In FIGS. 8A to 8E, the same reference numerals as those shown in FIG. 7 denote the same or corresponding parts. For example, as shown in FIG. 8A, the concave portions 35 may be provided at two positions different in Y-coordinate on two opposite side surfaces, or alternatively, the concave portions 35 may have a quadrangular shape having curved corners in the X-Y plane, as shown in FIG. 8B.

Figure 8C:
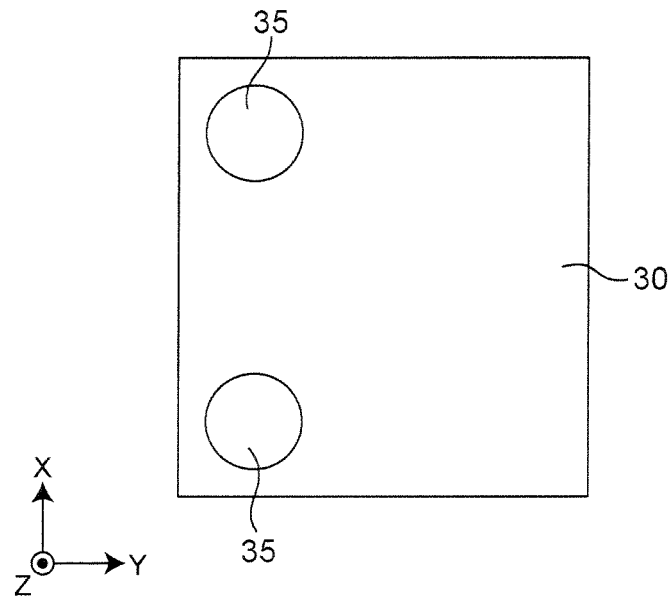
FIG. 8C is a plan view of yet another block used in the optical semiconductor module according to the second embodiment of the present invention.

Further, as shown in FIG. 8C, the concave portions 35 may be through holes formed through the block 30. In FIG. 8C, the through holes have a cylindrical shape, but may have a quadrangular prism shape or a polygonal prism shape.

Figure 8D:
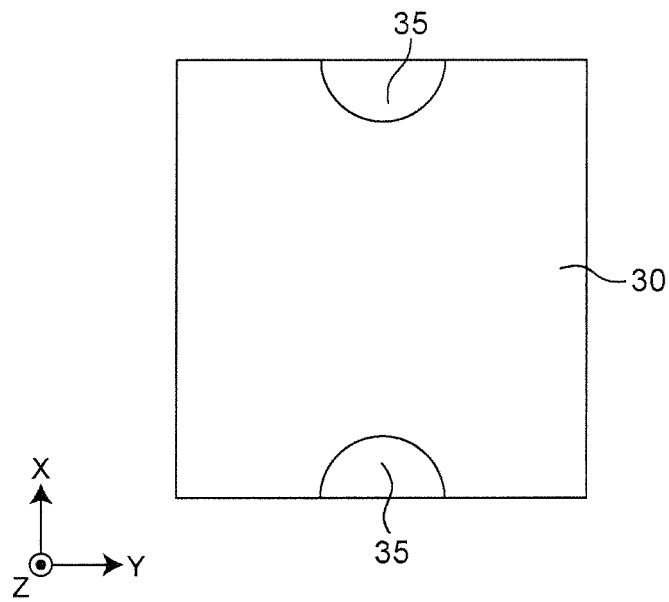
FIG. 8D is a plan view of yet another block used in the optical semiconductor module according to the second embodiment of the present invention.
Figure 8E:
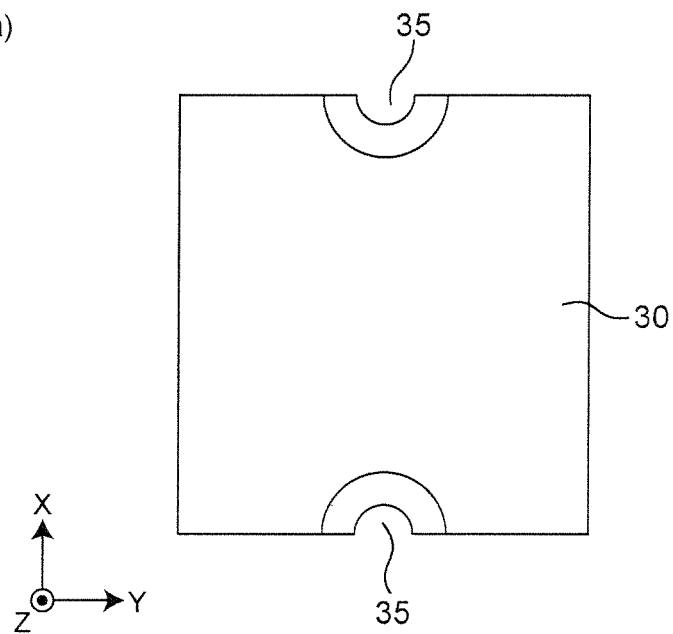
FIG. 8E(a) is a plan view of yet another block used in the optical semiconductor module according to the second embodiment of the present invention, and FIG. 8E(b) is a side view of the block when viewed along the X axis.
Figure 8E:
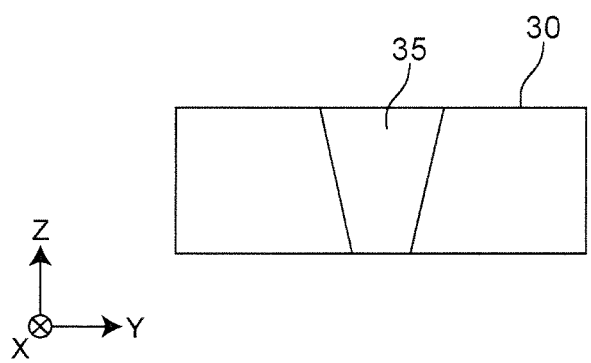

Furthermore, in FIGS. 8A to 8C, the concave portions 35 extends through the block 30 from the front surface to the back surface, or alternatively, as shown in FIG. 8D, the concave portions 35 extending from the front surface of the block 30 need not reach the back surface. The concave portions 35 shown in FIGS. 8A to 8C may have such a bottomed structure.

Further, as shown in FIG. 8D, the inner walls of the concave portions 35 may be tapered such that the cross section of the concave portions 35 in the X-Y plane gradually decreases downward. Such a tapered shape causes, even with each of the projections 301 of the collet 300 and a corresponding one of the concave portions 35 of the block 30 slightly misaligned with each other when inserting the projections 301 into the concave portions 35, the projections 301 to be guided along the inner walls of the concave portions 35 to eliminate the misalignment. In this case, it is preferable that lower ends of the concave portions 35 be fixed in contact with the inner walls of the concave portions 35 with the bottom surface of the collet 300 in contact with the upper surface of the block 30.

Figure 9:
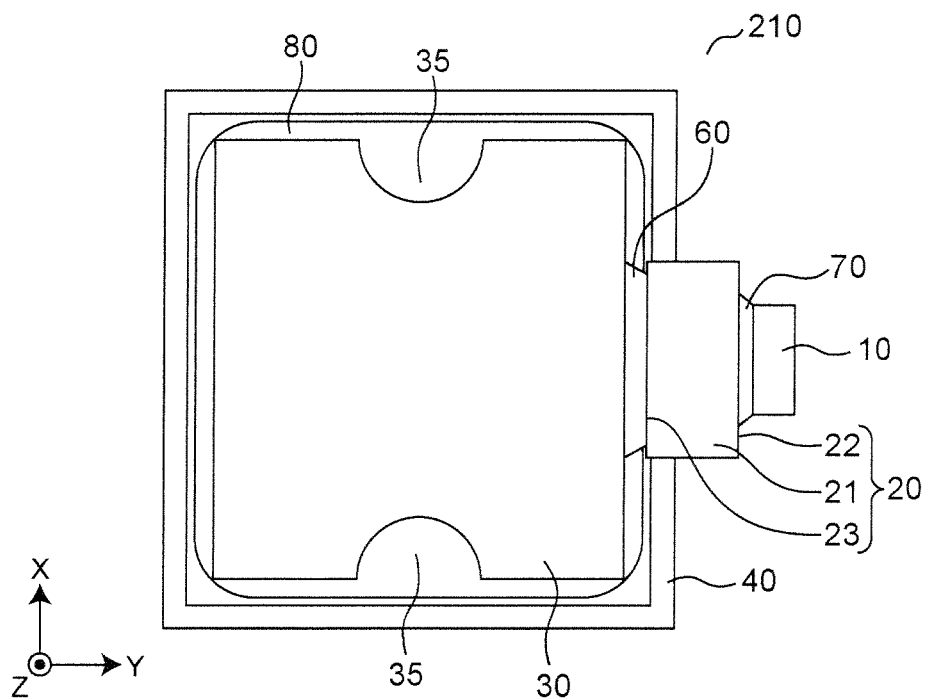
FIG. 9(a) is a plan view of another optical semiconductor module according to the second embodiment of the present invention.
FIG. 9(b) is a side view of the optical semiconductor module.
Figure 9:
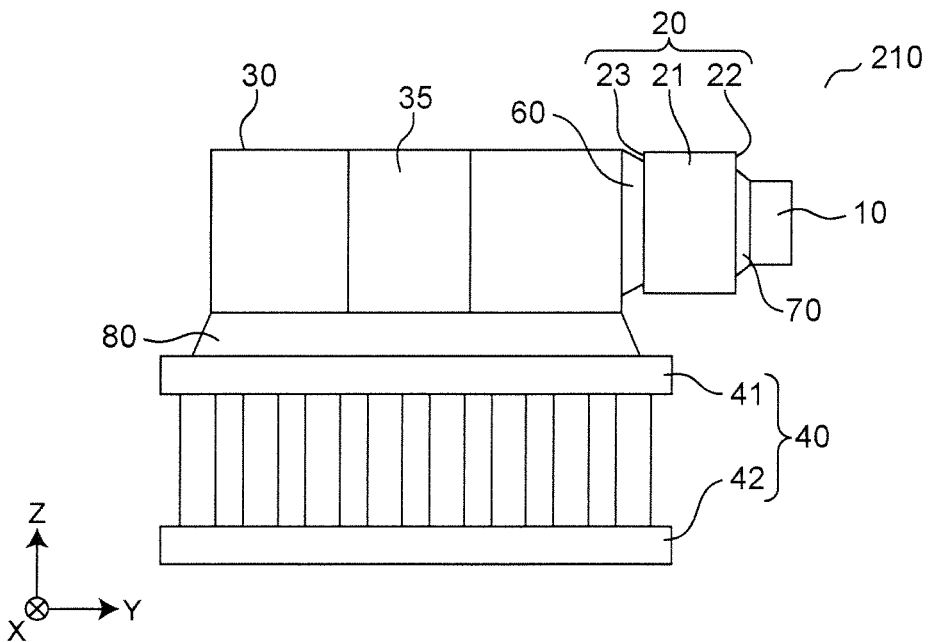
Figure 10:
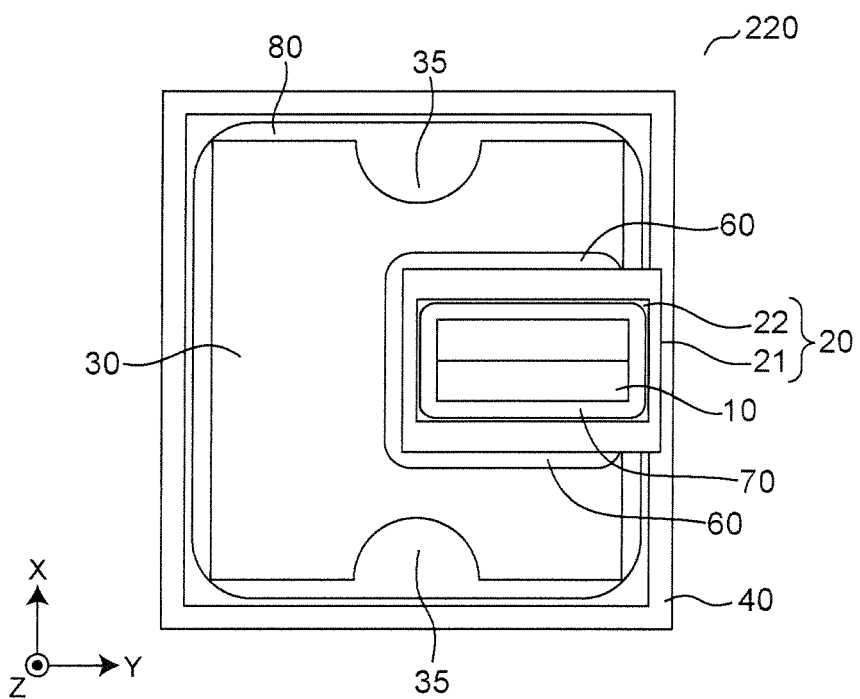
FIG. 10(a) is a plan view of yet another optical semiconductor module according to the second embodiment of the present invention.
FIG. 10(b) is a side view of the optical semiconductor module.
Figure 10:
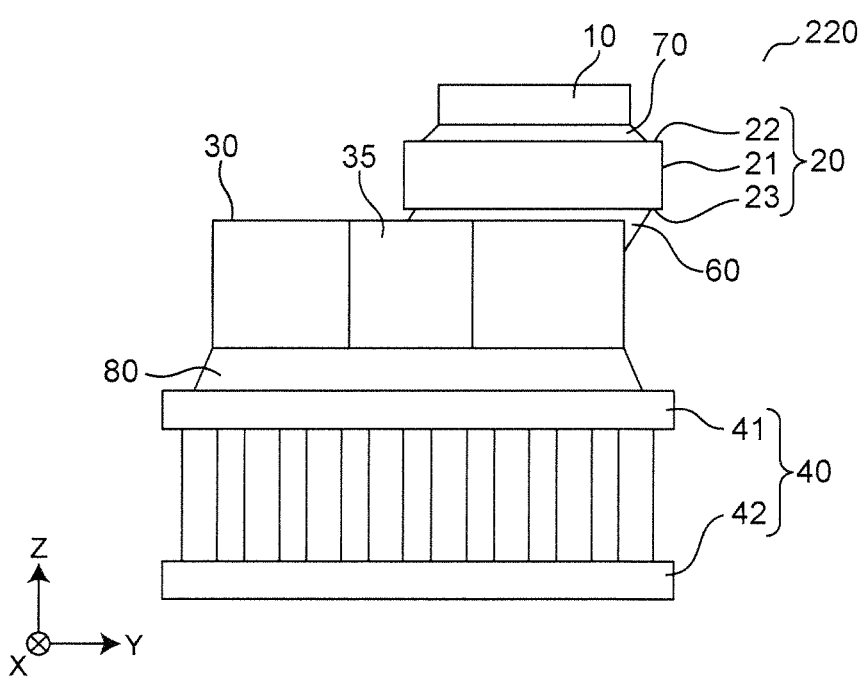
Figure 11:
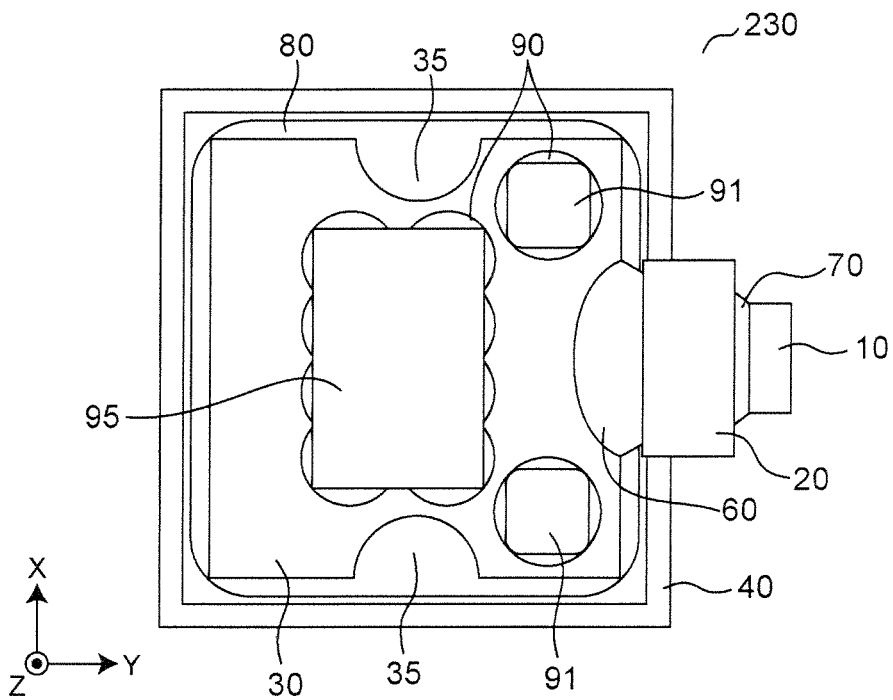
FIG. 11(a) is a plan view of yet another optical semiconductor module according to the second embodiment of the present invention.
FIG. 11(b) is a side view of the optical semiconductor module.
Figure 11:
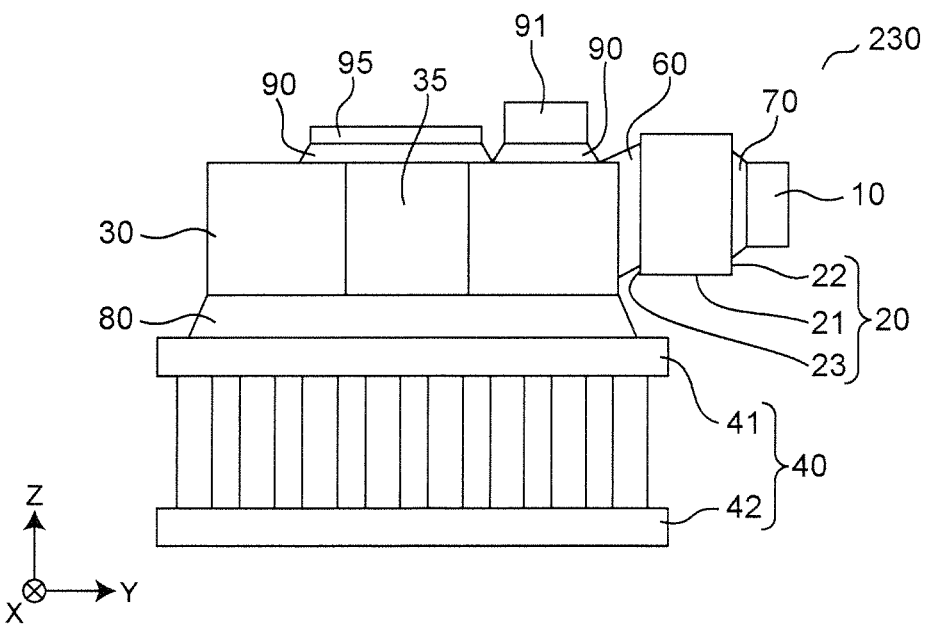

FIGS. 9(a), 10(a), and 11(a) are plan views of other optical semiconductor modules, denoted by 210, 220, and 230 as a whole, according to the second embodiment of the present invention, and FIGS. 9(b), 10(b), and 11(b) are side views of the optical semiconductor modules. In FIGS. 9 to 11, the same reference numerals as those shown in FIG. 7 denote the same or corresponding parts.

In the optical semiconductor module 200 shown in FIG. 7, the solder 60 for bonding the sub-mount 20 and the block 30 also extends onto the front surface of the block 30; however, the solder 60 may be bonded only to the side surface of the block 30, as in the optical semiconductor module 210 shown in FIG. 9, for example.

Further, as in the optical semiconductor module 220 shown in FIG. 10, even with a structure the sub-mount 20 having the semiconductor laser chip 10 fixed to the front surface of the sub-mount 20 is fixed to the front surface of the block 30 with the sub-mount 20 protruding outward beyond the periphery of the block 30, the concave portions 35 may be provided on two side surfaces of the block 30 perpendicular to the side surface beyond which the sub-mount 20 protrudes.

Furthermore, in the optical semiconductor module 230 shown in FIG. 11, the above-described optical semiconductor module 200 further includes other necessary components such as a capacitor 91 and an amplifier substrate 95 on the front surface of the block 30. As described above, disposing the sub-mount 20 having the semiconductor laser chip 10 fixed thereto on the side surface of the block 30 allows the other components such as the capacitor 91 to be disposed on the front surface of the block 30, which in turn makes it possible to reduce the size of the optical semiconductor module 230. Even with such an optical semiconductor module 230, scrubbing and accurate positioning can be made using the collet 300.

As described above, the optical semiconductor modules 200, 210, 220, and 230 according to the second embodiment of the present invention allow the block 30 to be held by suction without causing the collet 300 to come into contact with the semiconductor laser chip 10 or the sub-mount 20 even with a structure where the sub-mount 20 having the semiconductor laser chip 10 mounted thereon protrudes beyond the periphery of the block 30 that causes the conventional pyramid collet to come into contact with the semiconductor laser chip 10 or the sub-mount 20. Further, the block 30 has the concave portions 35 on the opposite side surfaces of the block 30 and is held in contact with the projections 301 of the collet 300, so that it is possible to scrub, when the block 30 is soldered, the block 30 on the thermo-module 40 without causing the holding by suction of the block 30 is released or the position of the holding by suction is shifted. This allows the solder to reliably wet-spread all over the bonding surface and allows the film thickness of the solder to be uniform. Further, after the scrubbing, the collet 300 is moved to a predetermined position and then cooled, allowing accurate positioning of the block 30 and accurate optical axis alignment of the semiconductor laser chip 10. In addition, since a fillet is formed at portions including the inner walls of the concave portions 35, it is possible to ensure soldering excellent in heat and shock resistance.

According to the embodiments of the present invention, a description has been given of a case where solder is used as the bonding material, but the bonding material is not limited to such solder. For example, a sintered metal paste made of a mixture of a solvent and micro-sized metal particles, nano-sized metal particles, or micro-sized and nano-sized metal particles may be used as the bonding material.

DESCRIPTION OF REFERENCE SYMBOLS

10 SEMICONDUCTOR LASER CHIP
20 SUB-MOUNT
21 CERAMIC SUBSTRATE
22, 23, 24 CONDUCTOR PATTERN
25 CONCAVE PORTION
30 BLOCK
35 CONCAVE PORTION
40 THERMO-MODULE
60, 70, 80 SOLDER
100 OPTICAL SEMICONDUCTOR MODULE
300 COLLET

The invention claimed is:

1. A semiconductor module comprising:
a first member; and
a second member having a front surface, a back surface, side surfaces connecting the front surface and the back surface, the first member and the back surface being bonded together with a bonding material interposed between the first member and the back surface, wherein
the side surfaces includes a first side surface, and a second side surface and a third side surface arranged on both sides of the first side surface,
a semiconductor element is provided on a connection area within the front surface of the second member,
a concave portion is formed on each of the second side surface and the third side surface, the concave portion extending from the front surface of the second member toward the back surface of the second member, and
the concave portion has an opening provided on the front surface of the second member, the opening being provided separately from the connection area and being smaller in width than the second side surface and the third side surface.

2. A method of manufacturing a semiconductor module in which a second member having a semiconductor element mounted thereon is bonded to a first member, the method comprising:

causing a collet to hold a front surface of the second member by suction and to insert and hold a projection of the collet into at least two concave portions formed on the second member;
placing the second member onto the first member with a bonding material interposed between the second member and the first member; and
scrubbing while causing the collet to press the first member against the second member.

3. The method of manufacturing a semiconductor module according to claim 2, further comprising:
melting, before the scrubbing, the bonding material that is solder; and
cooling the solder and soldering the first member onto the front surface of the second member after the scrubbing.

4. The semiconductor module according to claim 1, wherein
the second member is a sub-mount, and
the concave portion is disposed to allow a projection of a collet to be held in the concave portion with the front surface of the sub-mount held by suction by the collet.

5. The semiconductor module according to claim 1, wherein
the second member is a sub-mount, and
the concave portion is a semi-cylindrical groove that connects the front surface of the sub-mount and the back surface of the sub-mount and has a semicircular cross section parallel to the front surface of the sub-mount.

6. The semiconductor module according to claim 1, wherein
the second member is a sub-mount, and
the concave portion is a semi-cylindrical groove having a semicircular cross section parallel to the front surface of the sub-mount.

7. The semiconductor module according to claim 1, wherein the first member is a block, and the second member is a sub-mount.

8. The semiconductor module according to claim 1, wherein the second member is a block, and the first member is bonded to the block.

9. The semiconductor module according to claim 1, wherein the concave portion is a groove formed on the side surfaces of the second member.

10. The semiconductor module according to claim 1, wherein the concave portion extends from the front surface of the second member to the back surface of the second member.

11. The semiconductor module according to claim 1, wherein
the semiconductor element is provided over the connection area within the front surface of the second member, and
the opening is spaced from the connection area to be separated from the connection area.

* * * * *